United States Patent [19]
Kawashita

[11] Patent Number: 5,283,790
[45] Date of Patent: Feb. 1, 1994

[54] EXTERNAL STORAGE APPARATUS AND DEFECTIVE BLOCK REASSIGNMENT PROCESSING METHOD THEREFOR

[75] Inventor: Asayoshi Kawashita, Chigasaki, Japan

[73] Assignee: Hitachi, Ltd., Tokyo, Japan

[21] Appl. No.: 630,304

[22] Filed: Dec. 19, 1990

[30] Foreign Application Priority Data

Dec. 25, 1989 [JP] Japan ................ 01-335778

[51] Int. Cl.[5] .............................................. G06F 11/00
[52] U.S. Cl. ..................................... 371/101; 371/8.1; 395/650; 395/425
[58] Field of Search .................... 371/10.1, 10.2, 8.1, 371/40.1, 8.2; 395/575 MS, 650, 425; 369/58; 365/200

[56] References Cited

U.S. PATENT DOCUMENTS

| | | | |
|---|---|---|---|
| 4,380,066 | 4/1983 | Spencer et al. | 371/10.1 |
| 4,833,665 | 5/1989 | Tokumitsu et al. | 369/58 |
| 5,060,197 | 10/1991 | Park et al. | 371/10.2 |
| 5,077,736 | 12/1991 | Dunphy, Jr. et al. | 371/10.1 |
| 5,124,987 | 6/1992 | Milligan et al. | 371/10.1 |
| 5,151,990 | 9/1992 | Allen et al. | 395/650 |

OTHER PUBLICATIONS

Section 8.1.3. of "Explanation of Reassign Blocks Command", of Japanese Version of the ANSI Standards X3. 131-1986, by the Japanese Standards Association (No English translation).

Primary Examiner—Robert W. Beausoliel, Jr.
Assistant Examiner—Phung M. Chung
Attorney, Agent, or Firm—Kenyon & Kenyon

[57] ABSTRACT

An external storage apparatus which includes a recording medium on which a replacing area or defective spare block area is used in place of a defective block. Reassignment processing of the replacing area to the defective block is performed under a command issued by a host system. A managing unit manages the number of blocks remaining unused in the replacing area. Upon reception of the command for assigning the replacing area to the defective block from the host system, the reassignment processing of the defective block from the host system, the reassignment processing of the defective block is performed, and the number of blocks remaining in the replacing area which is managed by the managing unit is supplied to the host system.

10 Claims, 7 Drawing Sheets

| SENSE CODE | SENSE KEY | CONTENTS |
|---|---|---|
| 31H | 3H | MEDIUM FORMAT CORRUPTED: INDICATOIN THAT FORMAT UNIT COMMAND FAILED TO END NORMALLY DUE TO DEFECT OF RECORDING MEDIUM |
| 32H | 3H | NO DEFECT SPARE LOCATION AVAILABLE: INDICATION THAT REASSIGNMENT PROCESSING WAS IMPOSSIBLE BECAUSE OF UNAVAILABILITY OF SPARE BLOCKS IN RESERVING AREA |
| 33H | 3H | FEW DEFECT SPARE LOCATION AVAILABLE: INDICATOIN THAT NUMBER OF REMAINING SPARE BLOCKS HAS BEEN DECREASED TO EIGHT |
| 34H ～ 3F$^H$ | X$^H$ | NOT ISSUED |

EXTERNAL STORAGE APPARATUS AND DEFECTIVE BLOCK REASSIGNMENT PROCESSING METHOD THEREFOR

BACKGROUND OF THE INVENTION

The present invention relates to a defective block reassignment processing method and system for an external storage apparatus such as a hard disk apparatus and the like. More particularly, the present invention is concerned with a defective block reassignment processing system for an external storage apparatus in which load of software in a host system can be reduced, in a data processing system connected to the host system through a software interface such as an SCSI interface.

In general, in an external storage apparatus such as a hard disk apparatus and others, a replacing or spare block area is previously reserved on a recording medium, and when a defective block is found, block reassignment processing is performed.

Heretofore, the block reassignment processing for replacing a defective block has been performed in a manner which will be outlined below. Assuming that a read/write request is issued from a host system and that a block in an external storage apparatus such as a hard disk apparatus which block is relevant to that request is defective, an abnormal end due to a defect of the recording medium is informed to the host system. Upon reception of the abnormal end information, the host system issues to the hard disk apparatus a command for commanding the replacement of the defective block (this command is generally referred to as a reassign block command). In response to the reassign block command, the hard disk apparatus reassigns the spare block area to the defective block. When a spare block is no longer available in the spare block area, the reassign block command is terminated in the check condition status and a medium error is set in a sense key, which means that the command has been ended abnormally in an unrecoverable error state because of the defect in the recording medium or error of recorded data.

An example of such block reassignment processing scheme for a hard disk apparatus with an SCSI interface is disclosed in Section 8.1.3 entitled "Explanation of REASSIGN BLOCKS Command" "Japanese Version of the ANSI Standards X3.131-1986" (published by the Japanese Standards Association).

It is however noted that when the defective block reassignment processing is performed by the hard disk apparatus in response to the reassign block command issued by the host system the information of the medium error due to unavailability of a spare block area means wastage involved in the processing and should preferably be evaded in advance. To this end, it is necessary to suppress the issuance of such reassign block command by the host system which ultimately results in issuance of the medium error information of unavailability of the spare block area from the hard disk apparatus. Under the circumstances, the number of the spare blocks remaining unused in the spare block area of the hard disk apparatus has heretofore been managed by the host system. However, since the size of the spare block area differs from one after another manufacture of hard disk apparatuses and in dependence on the capacity thereof, the spare block number management performed by a host system to which a variety of hard disk apparatuses are connected become considerably complicated. Besides, a lot of time is taken for the program-based processing for the block reassignment, involving degradation in the system performance to a problem.

Another disadvantage of a hard disk apparatus with an SCSI interface or the like can be seen in that although the interface is regulated in accordance with the ANSI Standards, the specifications thereof tend to differ from one to another disk manufacture, particularly in the case of software interface because of rather lenient regulation, which makes it difficult for the host system to alter or modify the interface specifications in a facilitated manner.

SUMMARY OF THE INVENTION

It is therefore an object of the present invention to provide a defective block reassignment processing method for an external storage apparatus in which the remaining amount of the spare block area of the external storage apparatus such as a hard disk apparatus can be managed properly or appropriately by a host system without increasing a burden imposed thereby on the relevant program of the host system while preventing the useless issuance of a reassign block command.

Another object of the present invention is to provide a defective block reassignment processing system in which the defective block reassignment processing performed in the external storage apparatus such as a hard disk apparatus and the like is not fixed but the processing can easily be altered or modified by the host system.

In view of the above and other objects which will become more apparent from the following description, it is proposed according to an aspect of the present invention that a spare block area containing blocks to be replaced by defective blocks is provided on a recording medium of the external storage apparatus in combination with means for managing the number of spare blocks remaining unused in the spare block area for thereby allowing the defective block to be replaced by a spare block of the spare block area under command of a host system. Upon reception of the defective block replace command (also referred to as the reassignment block command) from the host system, a defective block reassign processing is performed in the external storage apparatus, and the number of spare blocks remaining available in the spare block area is messaged to the host system.

According to another aspect of the present invention, a message of the remaining number of the spare blocks to the host system mentioned above is performed when the number of the spare blocks remaining available becomes smaller than a predetermined value.

Further, according to still another aspect of the present invention, a part or whole of a control program for controlling the processing performed in an external storage apparatus is loaded down to the apparatus from the host system, whereby the processing involved in messaging the number of the spare blocks remaining unused to the host system is made to be alterable arbitrarily from the side of the host system.

According to yet another aspect of the present invention, the control program loaded down to the external storage apparatus is saved on a recording medium to be fetched in a control program stored previously on the recording medium upon power-on.

With the arrangements proposed by the present invention, every time the reassign block command is executed in accordance with an internal control program of an external storage apparatus such as a hard disk apparatus, the number of spare blocks remaining unused in the spare block area is decremented, whereon the resultant remaining block number is checked. When that number has been decremented to a predetermined value, this status is messaged as an SCSI check condition to the host system through an SCSI interface. By virtue of this feature, the host system program can get rid of a burden of managing the number of the blocks remaining in the spare block area, while useless issuance of the reassign block command can effectively be prevented.

According to a further aspect of the present invention, a RAM for storing an internal control program is incorporated in the external storage apparatus such as a hard disk apparatus, wherein the block reassignment control program loaded down to the external storage apparatus is stored in the RAM. Alternatively, the control program loaded down from the host system is stored in the RAM and at the same time saved on a medium such as a disk. Upon power-on, the control program saved on the medium is written in the RAM, thus making the loading from the host system unnecessary. In this manner, the internal control program of the external storage apparatus is not fixed, whereby alteration or modification in the error messaging, error recovery method, command processing method, command validity check method and others as required by the host system can easily be realized.

DESCRIPTION OF THE PREFERRED EMBODIMENTS

Figure 1:
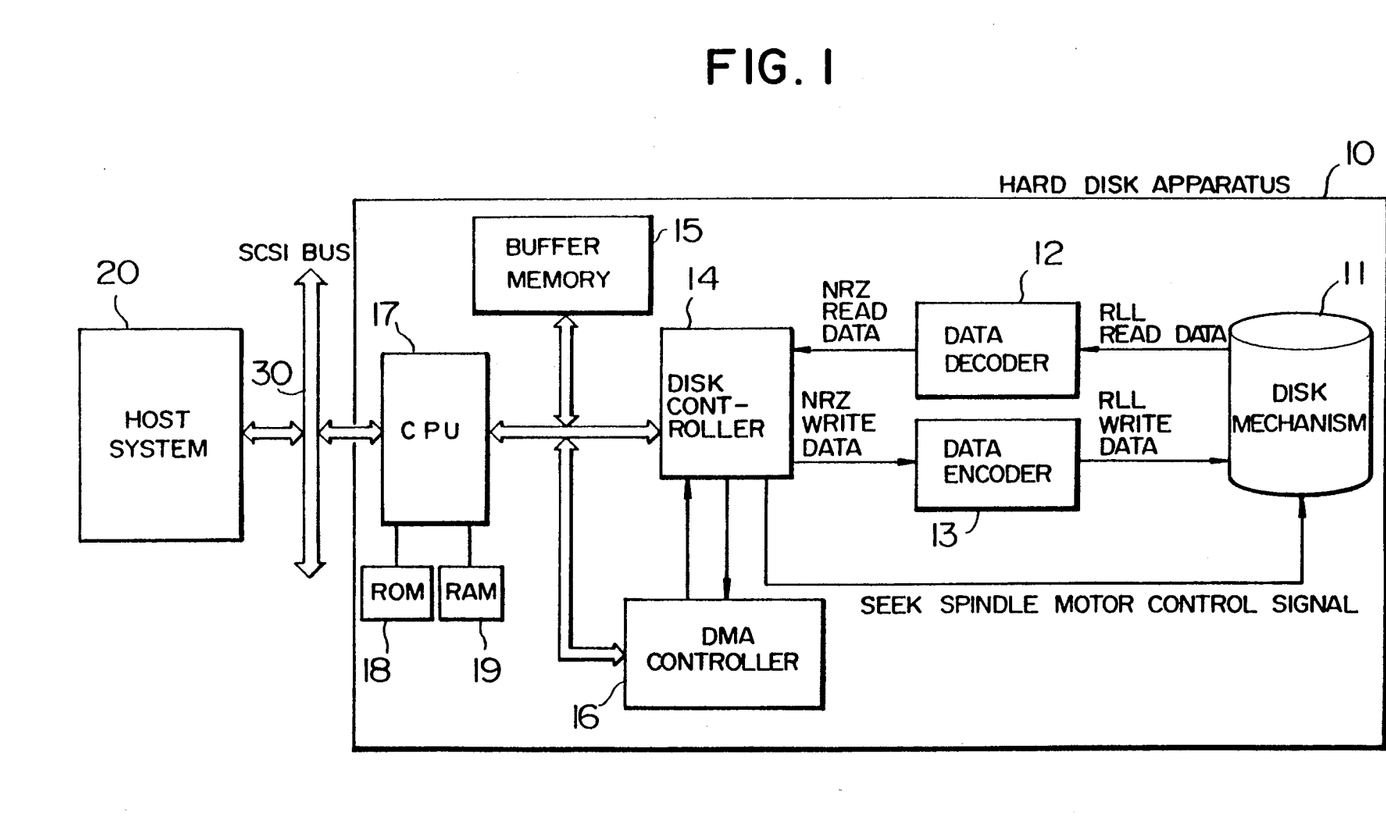
FIG. 1 shows in a block diagram a general arrangement of a system according to an exemplary first embodiment of the present invention.

FIG. 1 shows in a block diagram a general arrangement of a storage system according to a first embodiment of the present invention. In the following description, it is assumed that the external storage apparatus which the present invention concerns is implemented using a hard disk storage apparatus. It should however be understood that the external storage apparatus may be implemented using a semiconductor disk device, a floppy disk device, an optical disk system or the like without departing from the scope of the invention. Referring now to FIG. 1, a hard disk storage apparatus 10 is connected to a host system or host 20 through an SCSI bus 30. In this hard disk apparatus 10, a disk mechanical unit 11 includes disk plates, heads, a seek motor, a spindle motor and other mechanical parts. A data decoder 12 decodes RLL data (abbreviation of Run Length Limited Coded data) read out by the head (not shown) to NRZ data (abbreviation of Non-Return to Zero data). To the contrary, a data encoder 13 modulates NRZ data to RLL data. A disk controller 14 controls all operations taking place in the disk mechanical unit 11 such as read/write operation, seek operation and others. A buffer memory 15 temporarily stores data to be read from or written to the disk. Internal DMA data transfer between the disk controller 14 and the buffer memory 15 is performed under the control of a DMA controller 16. On the other hand, control for interfacing with the host 20 and the control of read/write operations performed by using hardware resource such as the disk controller 14, the DMA controller 16 and the buffer memory 15, as well as error check and other controls are performed by a CPU (central processing unit) 17. Control programs for the CPU 17 are stored in a read-only memory or ROM 18, while data to be processed by the CPU 17 are temporarily stored in a random access memory or RAM 19. Basically, operations of the individual parts constituting the hard disk apparatus 10 are approximately similar to those of the hard disk apparatus known heretofore. Accordingly, the following description will be directed to operations involved in a defective block reassignment or replacement processing.

Upon reception of a read/write command from the host 20 by the hard disk apparatus 10, the CPU 17 executes read/write operation in accordance with a program stored in the ROM 18 and informs the host 20 of normal/abnormal end of the read/write operation. In this case, when the host 20 receives the information of the abnormal end of the read/write operation due to presence of a defect in the storage medium from the hard disk apparatus, the host 20 issues a reassign block command for commanding reassignment or replacement of the defective block to the hard disk apparatus 10. When the reassign block command is received by the hard disk apparatus 10, the CPU 17 then performs a defective block reassignment processing in accordance with a control program stored in the ROM 18, to thereby update a link table for the reassignment processing stored in the RAM 19.

Figure 3:
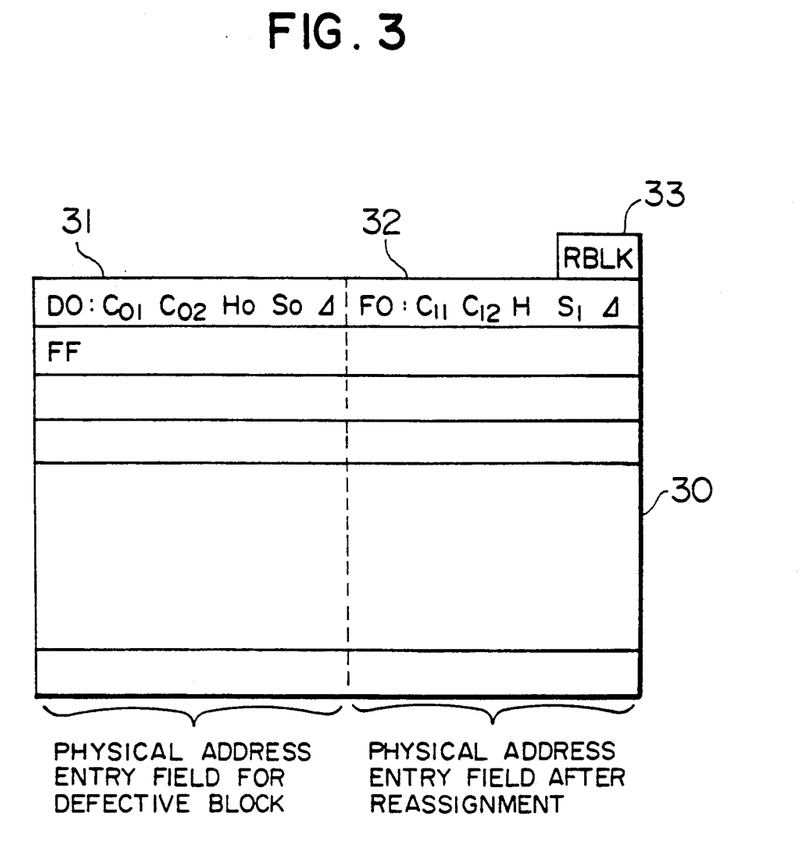
FIG. 3 shows, by way of example, a structure of a reassignment processing dedicated link table stored in a RAM.

FIG. 3 shows, by way of example, a structure of the reassignment processing dedicated link table stored in the RAM 19. As can be seen in the figure, the link table 30 comprises an defective block entry field 31, a assignment block entry field 32 and a remaining spare block count value (RBLK) area 33 which contains information about the number of unused spare blocks, remaining for replacing the defective blocks and which is according to the teachings of the present invention. In the defective block entry field 31, a symbol DO designates an identification code for indicating the address of the defective block to be replaced by a spare block. Values cf $C_{01}$ and $C_{02}$ succeeding the symbol DO in the defective block entry field 31 indicate the physical cylinder address of the defective block. Further, values $H_0$ and $S_0$ indicate a physical head address and a physical sector address of the defective block, respectively. Similarly, in the assignment block entry field 32, a symbol FO designates an identification code for indicating the address of a spare block by which the defective block is replaced (hereinafter referred to as the replaced block). Values $C_{11}$ and $C_{12}$ succeeding the symbol FO indicate the physical cylinder address of the replaced block, while values $H_1$ and $S_1$ indicate a physical head address and a physical sector address of the replaced block, respectively. A symbol FF designates the end of an effective data string in the link table 30. As the block reassignment processing proceeds, the entries of the address information of the defective block and the replaced block are added in succession to the existing entries. Consequently, the position of FF is correspondingly displaced. The link table 30 is written on the disk medium at any desired time and read out from the disk medium to be loaded in the RAM 19 upon power-on of the hard disk apparatus.

In the case of the instant embodiment now under consideration, the area RBLK of the link table is used to manage the number of spare unused blocks remaining in the spare block reserving area, wherein when the remaining block number has attained a predetermined value (e.g. eight in the case of the instant embodiment), this fact is informed to the host 20. Thus, the host can thus get rid of the burden of managing the number of remaining spare blocks in accordance with a corresponding program. Besides, when no spare blocks are remaining, excessive issuance of the reassign block command can be prevented.

Figure 2:
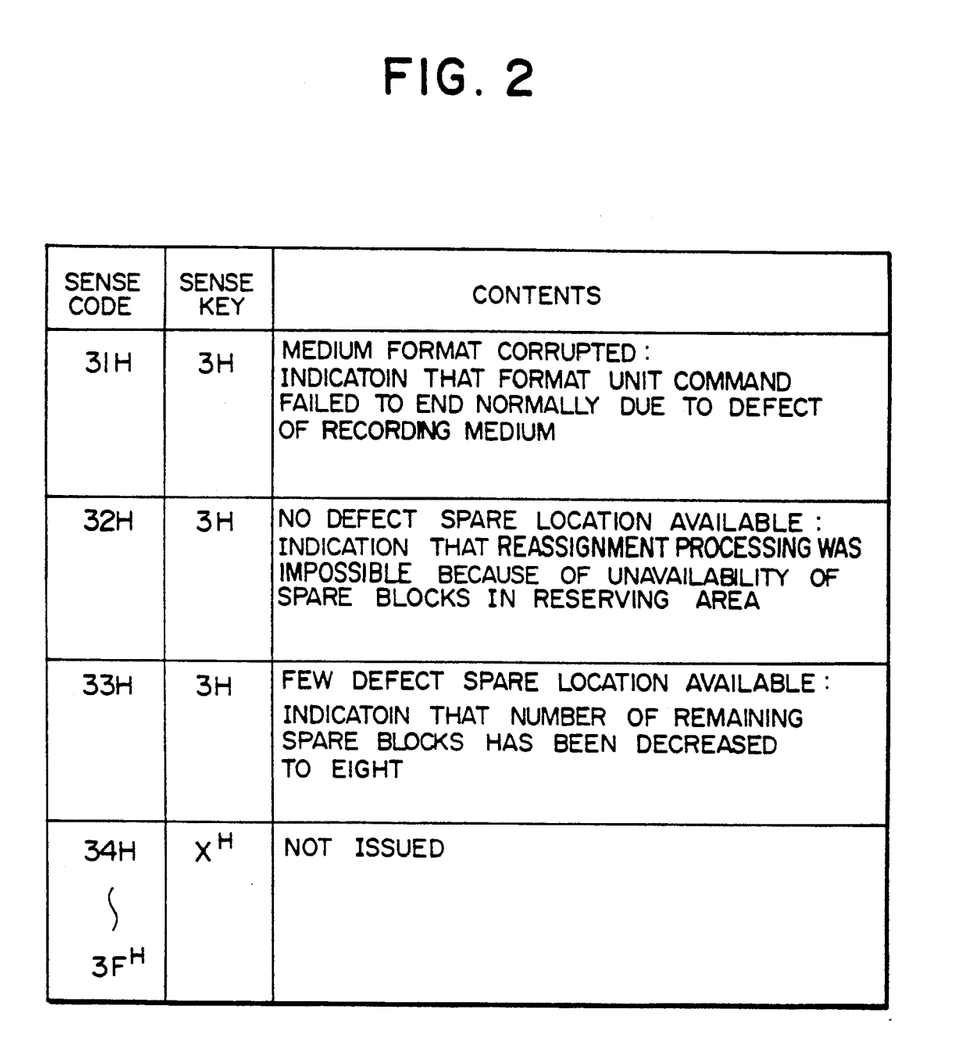
FIG. 2 is a view for illustrating sense codes in software interface of an SCSI hard disk apparatus to which the present invention is applied.

FIG. 2 shows some sense codes to which the present invention has relevance. According to the present invention, a sense code 33H is newly added. This sense code 33H is employed for indicating that the number of spare blocks remaining unused in the reserving area on the recording medium of the hard disk apparatus 10 has been decreased to eight.

Figure 4:
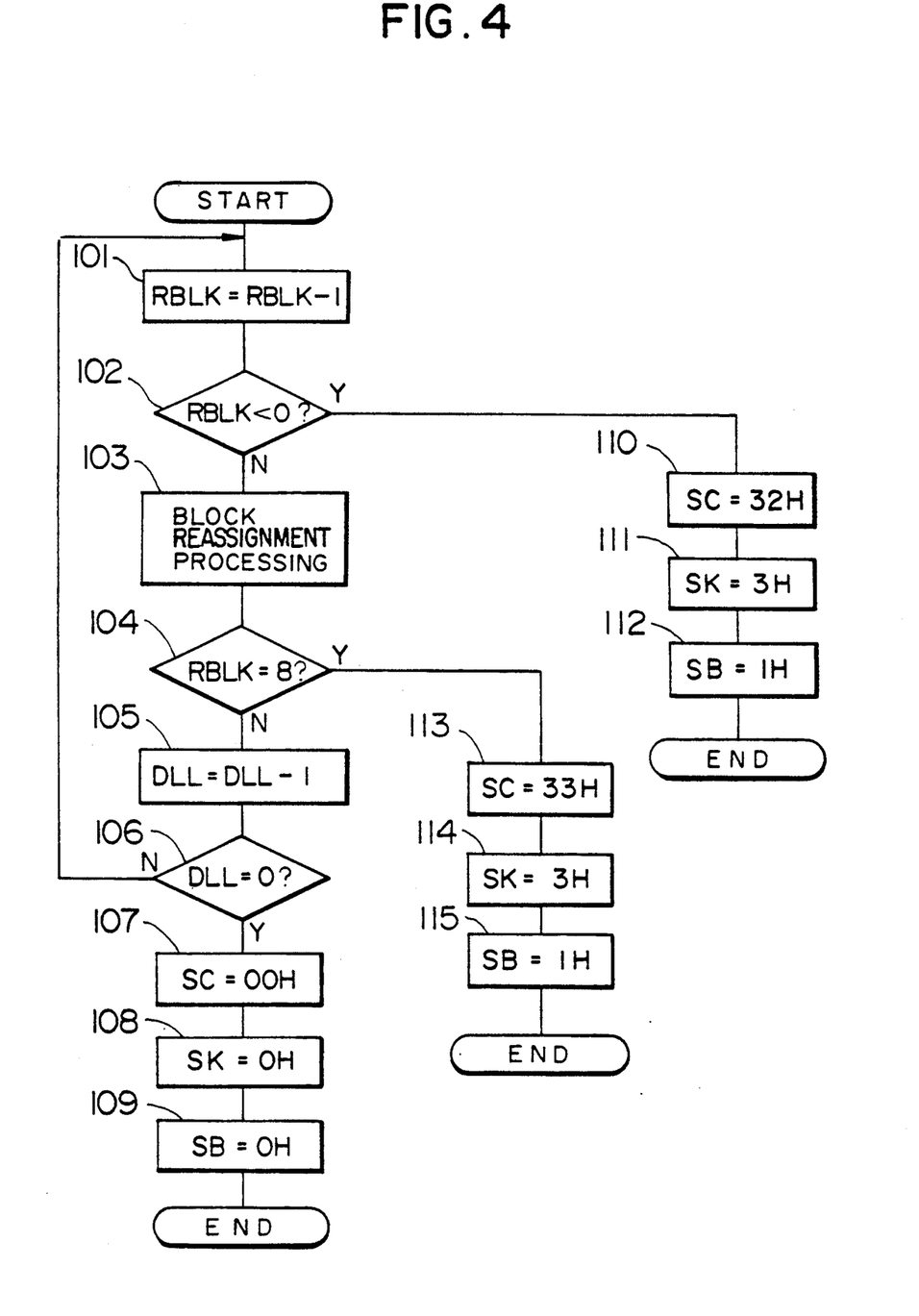
FIG. 4 is a flow chart for illustrating a processing of a reassign block command executed according to the teachings of the present invention.

FIG. 4 is a flow chart for illustrating a procedure for executing the reassign block command by the CPU 12 of the hard disk apparatus shown in FIG. 1. This flow chart constitutes a part of the control program stored in the ROM 18.

When the reassign block command is issued from the host system 20, the CPU 17 decrements by "1" the value of the RBLK 33 of the link table 30 stored in the RAM 19 in accordance with the control program stored in the ROM 18 (step 101). Subsequently, the RBLK value is checked (step 102). When the result of the check in step 102 is that RBLK <0, there is set "32H" (indicating unavailability of the spare block) in the sense code (SC) of the information to the host 20 at a step 110, while "3H" (indicating medium error) is set in a sense queue (SK) at a step 111 with "1H" (check condition) being set in a status byte (SH) at a step 112, whereon the command processing come to an end. It should be noted that by virtue of application of the teachings of the present invention, the reassign block command which will result in RBLK<0 is practically prevented from being issued.

When the RBLK value 33 is equal to or greater than "0", the block reassignment processing is performed (step 103). This block reassignment processing includes updating of the link table 30 shown in FIG. 3, performance of data write to the spare block. Subsequently, the value of the RBLK 33 in the link table 30 is again checked at a step 104. When the value of RBLK is equal to eight, the value "33H" (indicating that the number of the spare blocks remaining unused is eight) is set in the sense code (SC) at a step 113, while the value of "3H" is set in the sense queue (SK) at a step 114 with "1H" being set in the status byte (SB) at a step 115, whereon the command processing comes to an end. These processing steps are newly added according to the teachings of the present invention. In this case, the hard disk apparatus 10 interrupts the host 20 to send the sense code and others thereto. In this way, the host 20 can acknowledge that the number of spare blocks remaining unused becomes small.

On the other hand, in the case where the value of the RBLK 33 is other than eight, the CPU 17 decrements, at a step 105, by "1" the value of DLL (Defect List Length) indicating the length of the defective block which value is given from the host 20 as the parameter of the reassign block command. Subsequently, it is checked at a step 106 whether or not the value of DLL is "0". Unless it is "0", the first step 101 is resumed for executing the block reassignment processing for a next defective block. On the other hand, when the value of the DLL is "0", a value of "OOH" (indicating the normal end of the command) is set in the sense code (SC) at a step 107, while "OH" (indicating absence of abnormality in the disk apparatus) is set in the sense queue (SK) at a step 108 with "OH" (indicating no abnormality) being set in the status byte (SB) at a step 109, whereon the processing for the reassign block command comes to an end.

In the case of the embodiment described above, arrangement may also be made such that the number (value of the RBLK) of spare blocks remaining unused which is managed by the hard disk apparatus 10, can be read by the host system 20. It should further be mentioned that the teachings of the present invention can easily be applied to a hard disk apparatus in which the reassignment processing is performed for each track instead of for each block. Besides, the hard disk apparatus 10 may easily be implemented in such arrangement that information of the sense code (33H) to the host is designated by a switch or jumper pin provided on a control circuit substrate.

Figure 5:
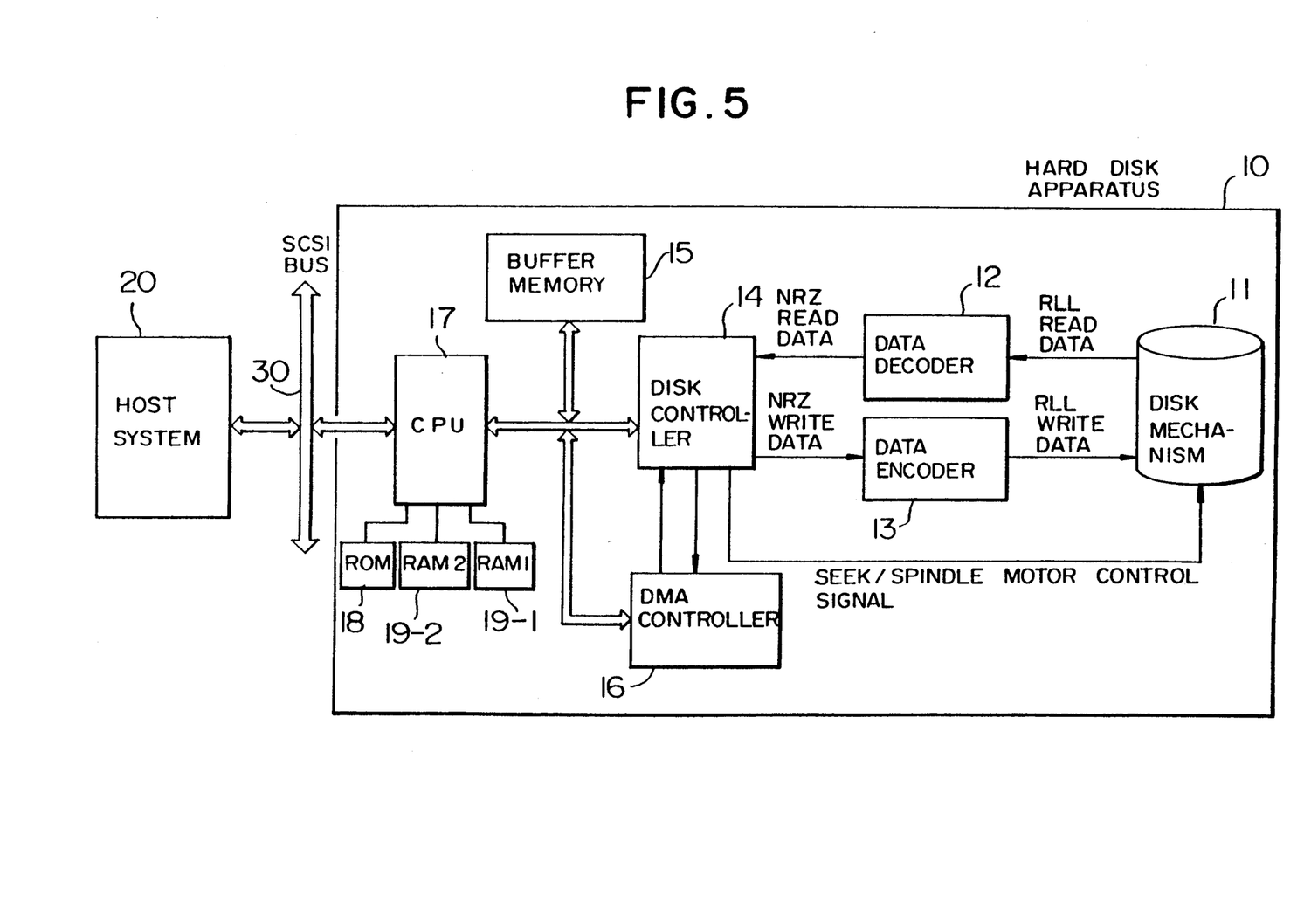
FIG. 5 is a block diagram showing a second embodiment of the present invention.

FIG. 5 is a block diagram showing a second embodiment of the present invention, which differs from the first embodiment in that a pair of first and second RAMs 19-1 and 19-2 are provided such that the control program for the hard disk apparatus 10 can be loaded down from the host 20 to be stored in the second RAM 19-2. With this arrangement, the ROM 18 can store only a bootstrap program and thus may be realized with a small storage capacity. Further, in the case of the second embodiment, a back-up region for the RAM 19-2 may be prepared on the disk medium for storing the control program sent from the host system 20 in the back-up region in addition to the storage of the program in the RAM 19-2.

Figure 6:
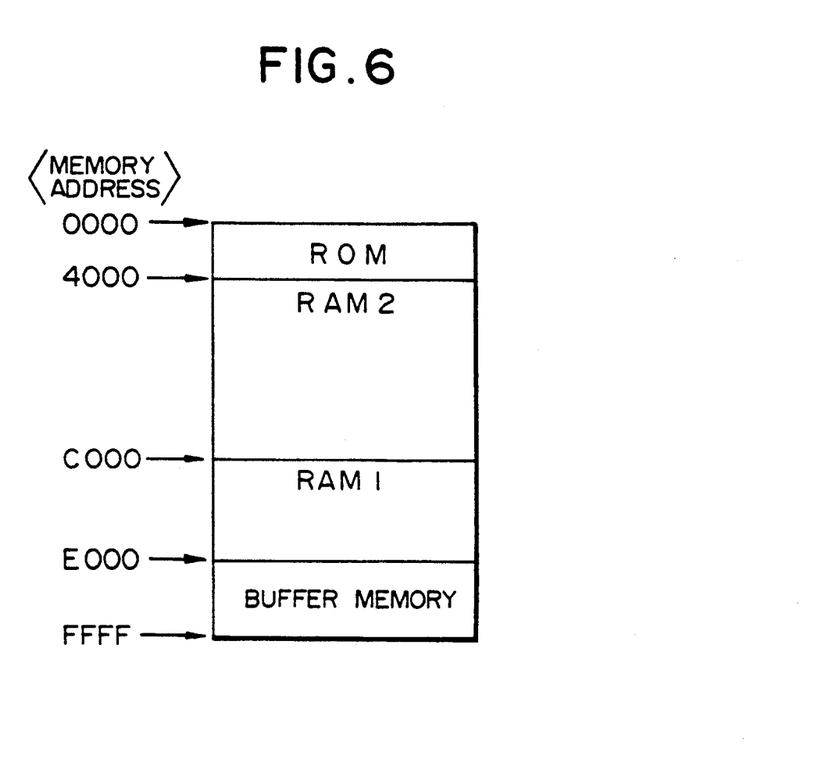
FIG. 6 is a diagram showing a memory map of the embodiment shown in FIG. 5.

FIG. 6 is a diagram showing a memory map of the hard disk apparatus according to the second embodiment of the present invention. Referring to FIG. 6, a memory address area "0000" to "3FFF" (corresponding to the ROM 18) is allocated to the bootstrap program which is operated for allowing the hard disk apparatus 10 to receive the control program from the host system 20 immediately after the power-on. A memory address area "4000" to "BFFF" (which corresponds to the RAM 19-2) are assigned to write therein the control program which the hard disk apparatus has received from the host system 20 through execution of the bootstrap program. A memory address area "C000" to "DFFF" (corresponding to the RAM 19-1) is assigned to temporarily store the data to be processed by the CPU 17 under the control of the control program mentioned above. Finally, a memory address area "E000" to "FFFF" (equivalent to the buffer memory 15) is assigned to allow data for DMA transfer to be performed.

Figure 7:
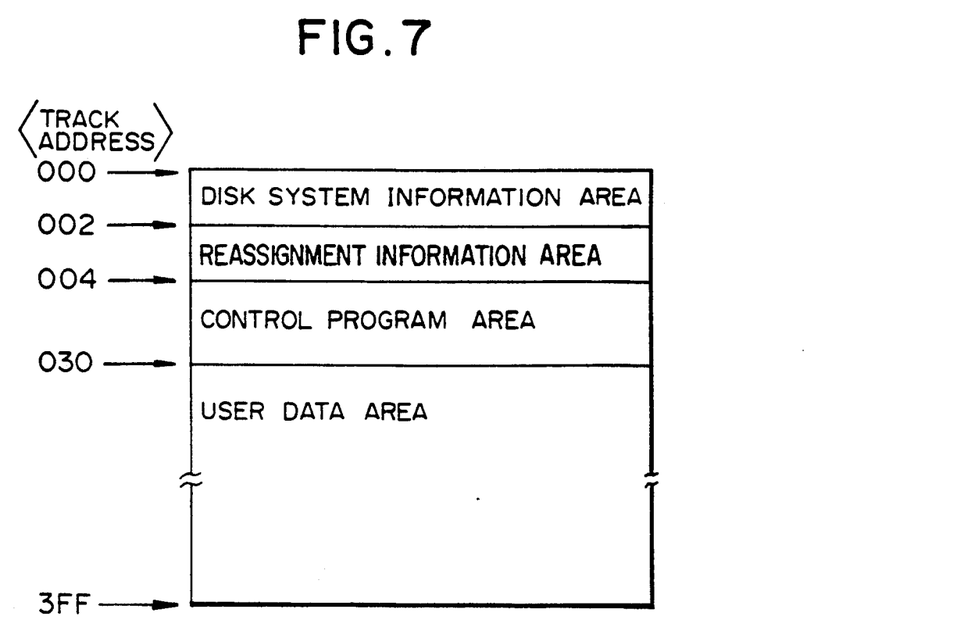
FIG. 7 is a view for illustrating a track map on a disk medium of the embodiment shown in FIG. 5.

FIG. 7 is a view for illustrating a track map on a disk medium of the hard disk apparatus 10. Referring to the figure, a track address area "000" to "001" (hexadecimal values) is allocated for the storage of disk system management information for the hard disk apparatus 10 itself. A track address area "002" to "003" is used for storing the information relevant to the reassignment for the defective blocks. A track address area "004" to "02F" serves for backing up the RAM 19-2 by storing the control program for the hard disk apparatus itself. Finally, a track address area "030" to "3FF" is used for storing user data.

Figure 8:
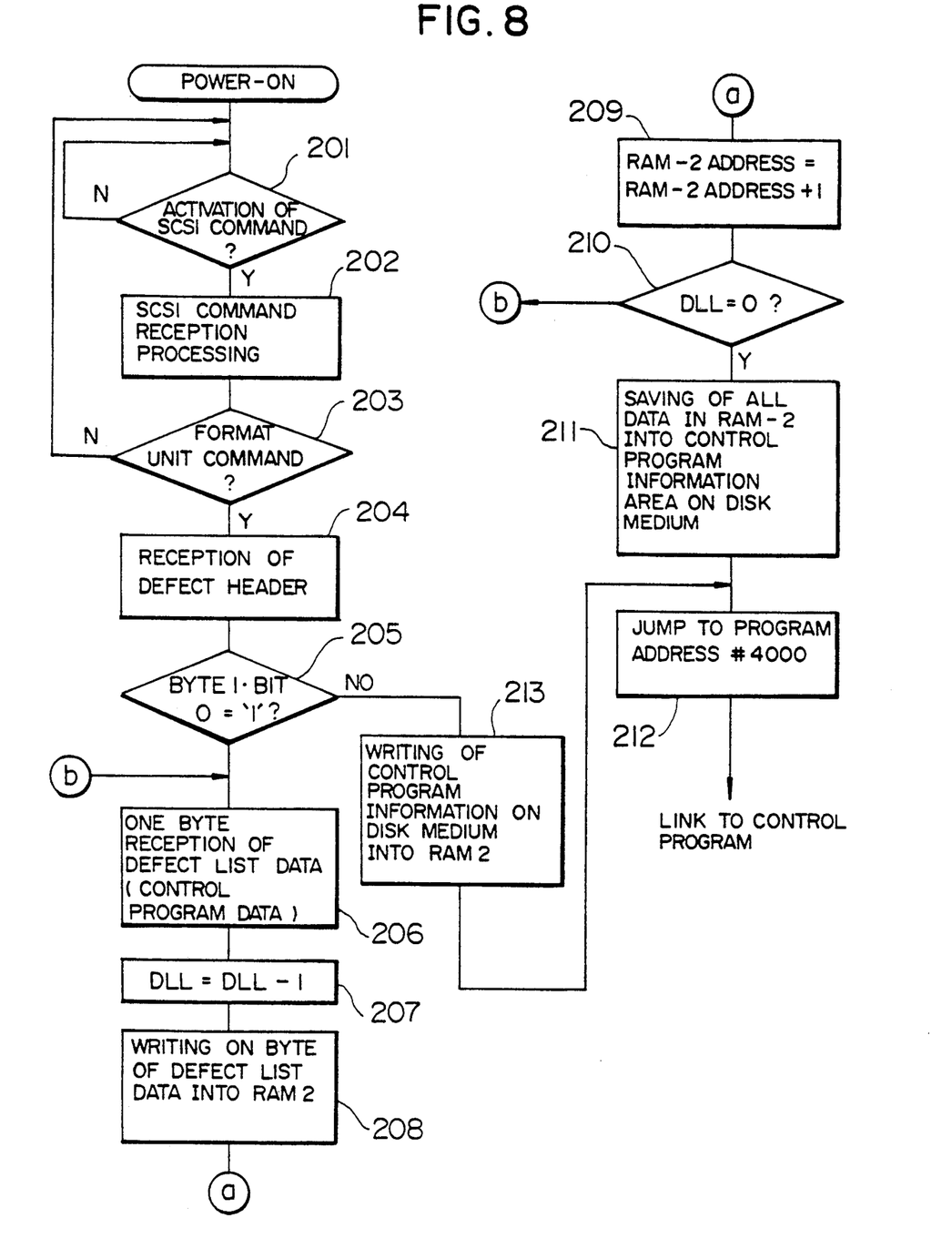
FIG. 8 shows a flow chart illustrating a bootstrap program executed in the embodiment shown in FIG. 5.

FIG. 8 shows a flow chart of the bootstrap program stored in the ROM 18 for illustrating operations performed by the CPU 17 of the hard disk apparatus 10 immediately after the power-on. The program is standardized in accordance with the ANSI Standards X3.131-1986.

Referring to FIG. 8, upon power-on, the bootstrap program is activated to wait for the command (SCSI command) from the host system 20 (step 201). When this command is issued, SCSI command reception processing is performed in accordance with the SCSI sequence procedure at a step 202, which is then followed by a step 203 where the byte "0" of five DCBs constituting the above mentioned command is checked to determine whether or not it is a FORMAT UNIT command. When an answer of the decision step 203 is affirmative (Y), then a defect list header of four bytes sent from the host 20 in succession to the FORMAT UNIT command is received (step 204). Then, it is checked at a step 205 whether the bit 0 of the byte 1 of the defective list header is "1" or not. When it is "0", the data in the control program area on the disk medium are written into the RAM 19-2 (at a step 213), whereon the procedure jumps to the address "4000" at a step 212.

On the other hand, when the bit 0 of the byte 1 of the defect list header is "1", one byte of the defect list data, i.e., control program data of the hard disk apparatus in the case of the second embodiment, sent from the host 20 in succession to the defect list header is received at a step 206. Subsequently, the value of the defect list length or DLL, which indicates the length of the control program data in the case of the second embodiment, sent previously with bytes 2 and 3 of the defect list header is decremented by "1" at a step 207. One byte of the defect list data is then written in RAM 19-2 in step 208, which is then followed by a step 209 where the address value of the RAM 19-2 is increased by "1". Thereafter, it is checked whether or not the value of the defect list length or DLL is now "0" at a step 210. Unless it is "0" (N), one byte of the next defect list data is received. On the other hand, when the answer of the decision step 210 is affirmative (Y) all the data in the RAM 19-2 (all the control program data received) are saved in the control program area on the disk medium shown in FIG. 7 at a step 211. Subsequently, the procedure jumps to the start address "4000" of the ordinary control program for the linkage thereto (step 212).

In the above description, it has been assumed that the format unit command is used for loading the control program. It should however be understood that such loading can easily be realized by using other commands. Further, although the processing has been described in conjunction with the hard disk apparatus, this is only for the purpose of exemplification of the invention. The processing can readily be realized in other type of external storage apparatus so far as the SCSI interface is provided.

As will be appreciated from the foregoing description, it becomes possible according to the teachings of the present invention that software of the host system can be rid of the necessity or burden of performing management of the spare blocks for replacing the defective blocks in the external storage apparatus such as a hard disk apparatus, whereby software for controlling the external storage apparatus can be simplified. Further there arises no more need to recognize the capacity of the reserving area for the spare blocks by the software to replace which differs from one to another manufacture and independence on the capacity of the external storage apparatus, which in turn means that replacement of the external storage apparatuses of different manufactures or types as well as increasing of the storage capacity and enhancement of performance of the external storage apparatus can be accomplished in a simplified and facilitated manner.

What is claimed is:

1. An external storage apparatus with a recording medium, including a plurality of recording blocks for recording data and a plurality of spare blocks for recording the data in place of defective ones of said recording blocks, comprising:

reassignment processing means responsive to reception of a reassignment command issued from a host system for performing processing for reassigning a spare block to a defective spare block and allowing said spare block to record data to be recorded in said defective spare block;

communication means for allowing information exchange between said host system and said reassignment processing means;

managing means for managing a number of spare blocks remaining unused for said reassignment processing performed by said reassignment processing means; and informing means for informing said host system of information concerning the number of remaining spare blocks managed by said managing means through said communication means.

2. An external storage apparatus according to claim 1, wherein said informing means sends said information to said host system when the number of remaining spare blocks becomes smaller than a predetermined value.

3. An external storage apparatus according to claim 1, wherein said informing means sends said information to said host system when the number of remaining spare blocks has attained a predetermined value.

4. An external storage apparatus according to claim 1, wherein said reassignment processing means includes:

storage means for storing a control program for controlling said reassignment processing; and control means for controlling the reassignment processing in accordance with said control program.

5. An external storage apparatus according to claim 4, further comprising:

means for reading out said control program from said host system through said communication means and storing said control program in said storage means.

6. An external storage apparatus according to claim 5, further comprising:

means for recording said control program read out from said host system at a predetermined area of said recording medium; and means responsive to power-on of said external storage apparatus for reading out said control program recorded on said recording medium and storing said control program in said storage means.

7. A method for reassigning a defective block in an external storage apparatus with a recording medium, including a plurality of recording blocks for recording data and a plurality of spare blocks for recording the data in place of defective ones of said recording blocks, comprising the steps of:

receiving a command from a host system, the command representing an assignment of a spare block to said defective block;

establishing correspondence of a physical address of said defective block to a physical address of said spare block in accordance with said command in order to record data in said spare block which was to be recorded in said defective block;

updating a management table for managing a number of remaining spare blocks of which a correspondence of a physical address of said remaining spare blocks to a physical address of a defective block has not yet been established; and supplying to said host system information concerning the number of the remaining spare blocks managed by said management table.

8. A method for reassigning a defective block according to claim 7, wherein said supplying step is executed when the number of remaining spare blocks becomes smaller than a predetermined value.

9. A method for reassigning a defective block according to claim 7, wherein said supplying step is executed when the number of remaining spare blocks attains a predetermined value.

10. A method for reassigning a defective block according to claim 9, wherein said information indicates that the number of remaining spare blocks has attained a predetermined value.

* * * * *